United States Patent
Yuan et al.

(10) Patent No.: US 9,264,074 B2
(45) Date of Patent: Feb. 16, 2016

(54) LDPC CODE MATRICES

(71) Applicant: Entropic Communications, Inc., San Diego, CA (US)

(72) Inventors: Shaw Yuan, San Diego, CA (US); Zong Liang Wu, San Diego, CA (US); David Barr, San Jose, CA (US); Shachar Kons, Haifa (IL)

(73) Assignee: ENTROPIC COMMUNICATIONS, LLC, Carlsbad, CA (US)

( * ) Notice: Subject to any disclaimer, the term of this patent is extended or adjusted under 35 U.S.C. 154(b) by 67 days.

(21) Appl. No.: 14/177,707

(22) Filed: Feb. 11, 2014

(65) Prior Publication Data

US 2015/0229332 A1    Aug. 13, 2015

(51) Int. Cl.
*H03M 13/00*  (2006.01)
*H03M 13/11*  (2006.01)

(52) U.S. Cl.
CPC ................................ *H03M 13/1177* (2013.01)

(58) Field of Classification Search
None
See application file for complete search history.

(56) References Cited

U.S. PATENT DOCUMENTS

| | | | |
|---|---|---|---|
| 6,961,888 B2 * | 11/2005 | Jin et al. | 714/752 |
| 7,139,964 B2 * | 11/2006 | Shen et al. | 714/758 |
| 8,171,383 B2 * | 5/2012 | Landau et al. | 714/790 |
| 8,448,053 B2 * | 5/2013 | Landau et al. | 714/790 |
| 8,484,545 B2 * | 7/2013 | McLaughlin et al. | 714/790 |
| 2005/0257119 A1 * | 11/2005 | Blankenship et al. | 714/759 |
| 2006/0206781 A1 * | 9/2006 | Choi et al. | 714/758 |
| 2010/0153819 A1 * | 6/2010 | Ueng et al. | 714/763 |

* cited by examiner

*Primary Examiner* — Daniel McMahon
(74) *Attorney, Agent, or Firm* — McAndrews, Held and Malloy Ltd.

(57) ABSTRACT

An LDPC parity check matrix includes a systematic portion having a plurality of systematic elements and a parity portion having a plurality of parity elements. The value of each systematic element determines a cyclic shift to be applied to rows of an identity submatrix corresponding to that element. The value of each parity element determines a cyclic shift to be applied to rows of an identity submatrix corresponding to that element. The weights of each column of a group of columns of the parity portion are the same.

20 Claims, 12 Drawing Sheets

$$H = \begin{bmatrix} 0 & 0 & 0 & 1 & 1 & 0 \\ 0 & 0 & 1 & 0 & 0 & 1 \\ 0 & 1 & 0 & 0 & 1 & 0 \\ 1 & 0 & 0 & 0 & 0 & 1 \\ 0 & 0 & 1 & 0 & 1 & 0 \\ 0 & 0 & 1 & 1 & 0 & 1 \\ 1 & 0 & 1 & 0 & 0 & 0 \\ 0 & 1 & 0 & 1 & 0 & 0 \\ 0 & 1 & 0 & 0 & 0 & 1 \\ 1 & 0 & 0 & 0 & 1 & 0 \\ 0 & 1 & 1 & 0 & 0 & 0 \\ 1 & 0 & 0 & 1 & 0 & 0 \end{bmatrix}$$

- Prior Art -

LDPC CODE MATRICES

This disclosure is directed generally to a communication network, and in particular some embodiments relate to encoding and decoding digital data in a communication network and to an LDPC parity check matrix.

Nearly all forms of electronic communication and storage systems use error-correcting codes. Error correcting codes compensate for the intrinsic unreliability of information transfer in these systems by introducing redundancy into the data stream. The mathematical foundations of error correcting were established by the Shannon-Hartley theorem, which defines for the channel, a quantity that specifies the maximum rate at which information can be reliably delivered through the channel.

Reliable transmission at rates approaching capacity generally requires the use of error correcting codes. Thus, error-correcting codes are designed to achieve sufficient reliability while approaching maximum channel, capacity. The complexity of implementing the error correcting code is an additional factor that frequently comes into play in practical applications of error correcting codes. Recent advances in error correcting coding systems resulting from the invention of turbo codes and the subsequent rediscovery and development of low-density parity-cheek ("LDPC") that can allow systems to approach the Shannon-Hartley theorem capacity while maintaining a reasonably practical level of complexity.

LDPC codes are defined by a sparse parity-check matrix H. Conventionally, this sparse matrix is often randomly generated, subject to the sparsity constraints. A valid codeword, x, based on a given parity cheek matrix, H, satisfies the condition 0=Hx, where 0 is the all-zeros vector. FIG. 1 illustrates an example sparse parity cheek matrix H for an LDPC code having a length of 12 (i.e., 12 columns in the matrix). Each row of the parity cheek matrix H represents a set of check equations that XOR to 0. LDPC codes are capacity-approaching codes, which means that practical constructions exist that allow the noise threshold to be set very close to Shannon's limit) for a symmetric, memoryless channel.

LDPC codes may also be represented by bipartite graphs, often called Tanner graphs. FIG. 2 illustrates an example Tanner graph 20. Tanner graph 20 represents the parity check matrix, H, in which one set of nodes, the variable nodes 22, corresponds to bits of the codeword, and the other set of nodes, the check nodes 26, sometimes called constraint nodes, correspond to the set of parity check constraints that define the code. Edges 24 in the graph connect variable nodes 22 to check nodes 26. A variable node and a check node are said to be neighbors if they are connected by an edge in the graph. The number of connections of a check node is called the check node degree or row weight in operation, a decoder calculates a log-likelihood ratio ("LLR") for each of the bits according to variable nodes 22 connected by an edge 24 with a particular check node 26. The calculation is an iterative process that takes into account LLR values associated with each of the other variable nodes 22. Because the process is iterative, the calculation of the LLRs for each variable node 22 continues in successive passes, updating the LLR value associated with each variable node 22 associated with one check node until the criteria for stopping the process has been achieved.

Because the LLR value of each of the variable nodes 22 involved in the process is recalculated and updated during the calculation, each variable node 22 can only be involved in one calculation at a time in a layered decoding architecture. That is, the calculation that is being done on the variable nodes 22 connected by edges 24 to a first check node 26a cannot be done simultaneously in a second check node operating on any of the same variable nodes 22. For example, variable node 22a is connected by an edge 24a to check node 26a. However, variable node 22a is also connected by an edge 24b to check node 26d. And yet, none of the same variable nodes 22 are connected to both check node 26a and check node 26b. Accordingly, the LLR can be calculated for all of the variable nodes 22 connected to cheek node 26a and check node 26b, but cannot be simultaneously calculated for all of the variable nodes connected to check node 26a and check node 26d (since at least one variable node 22a is connected to both check node 26a and check node 26d).

In the example of both FIG. 1 and FIG. 2, there is no common variable node 22 connected to both check node 26a and check node 26b. Likewise, there is no common variable node 22 between check node 26c and cheek node 26d, nor between check node 26e and check node 26f. Accordingly, the LLR calculation in this case can be performed by each such pair of check nodes simultaneously using two parallel sets of hardware (one set of hardware for calculating the LLRs associated with the variable nodes connected to the first check node 26a and the other set of hardware to calculate the LLRs associated with the variable nodes connected to the second check node 26b). Once the LLRs for the variable nodes 22 connected to the first pair 26a, 26b have been calculated in association with the first pair of check nodes 26a, 26b, hardware can be use to calculate the LLRs for the variable nodes 22 in connection with the second pair of check nodes 26c, 26d. It should be noted that each check node 26 is connected to four variable nodes 22. Accordingly, LLRs for eight of the twelve variable nodes 22 can be calculated at a time.

LDCP codes are used by a variety of communication devices and networks. One example of such a network is a network that operates in accordance to the Media over Coax Alliance ("MoCA") MAC/PHY Specification. In a single channel MoCA network, for example, the process of transmitting an aggregate data packet (A-PDU) over the network includes these steps:

A transmitting node requests a time slot for the transmission;

A Network Controller (NC) grants the request if channel resources are available;

The transmitting and receiving nodes transmit and receive packets at the specified times.

For this process to be successful, both the transmitter and the receiver independently calculate the appropriate LDPC forward error correction code parameters and the number of padding bits to be used. However, the existing Moca 2 parity check matrix has a lower triangular structure such that the reduced connection to other parts of the codeword results in more decoding errors in the parity bits leading to possibly more decoding iterations. This is especially true in the last parity column where column weight is one. Accordingly, a more robust parity cheek matrix can be provided.

SUMMARY

The disclosed method and apparatus provides a format for a robust LDPC parity cheek matrix. In various embodiments, the matrix includes a systematic portion having a plurality of systematic elements having a value, the value of each systematic element determining a cyclic shift to be applied to rows of an identity submatrix corresponding to that element; and a parity portion having a plurality of parity elements having a value, the value of each parity element determining a cyclic shift to be applied to rows of an identity submatrix corresponding to that element; wherein the weights of each column of a group of columns of the parity portion is the same. The LDPC parity check matrix may be used for data access, communication and storage, and may be used, for example for communications among a plurality of network nodes.

The LDPC parity check matrix of can be configured such that the group of columns of the parity portion having the same weight is made up of some or all of the columns of the parity portion. For example, in some embodiments all but one of the columns of the parity portion have the same weight while in other embodiments 50% or more of the columns of the parity portion have the same weight. In certain embodiments, the weight of a given column is equal to a total quantity of non-negative entries in that column, and a negative entry represents a corresponding submatrix having all zeros.

In various embodiments, an LDPC parity check matrix includes: a systematic portion having a plurality of systematic elements having a value, the value of each systematic element determining a cyclic shift to be applied to rows of an identity submatrix corresponding to that element; and a parity portion having a plurality of parity elements having a value, the value of each parity element determining a cyclic shift to be applied to rows of an identity submatrix corresponding to that element; wherein the weights of each column of a group of columns of the parity portion is the same.

In some embodiments, the LDPC parity check matrix can be configured such that the group of columns of the parity portion having the same weight comprises all of the columns of the parity portion, while in other embodiments, the parity portion having the same weight comprises all but one of the columns of the parity portion. In still further embodiments, the group of columns of the parity portion having the same weight comprises greater than 2 but fewer than all of the columns of the parity portion, or the group of columns of the parity portion having the same weight comprises 50% or more of the columns of the parity portion.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

FIG. 1 illustrates an example sparse parity check matrix, H for an LDPC code having a length of 12.

FIG. 4 which comprises

FIG. 5, which comprises

FIG. 6, which comprises FIGS. 6A and 6B, illustrates another example LDPC code matrix in accordance with one embodiment of the systems and methods described herein.

FIG. 7, which comprises

DETAILED DESCRIPTION

Figure 2:
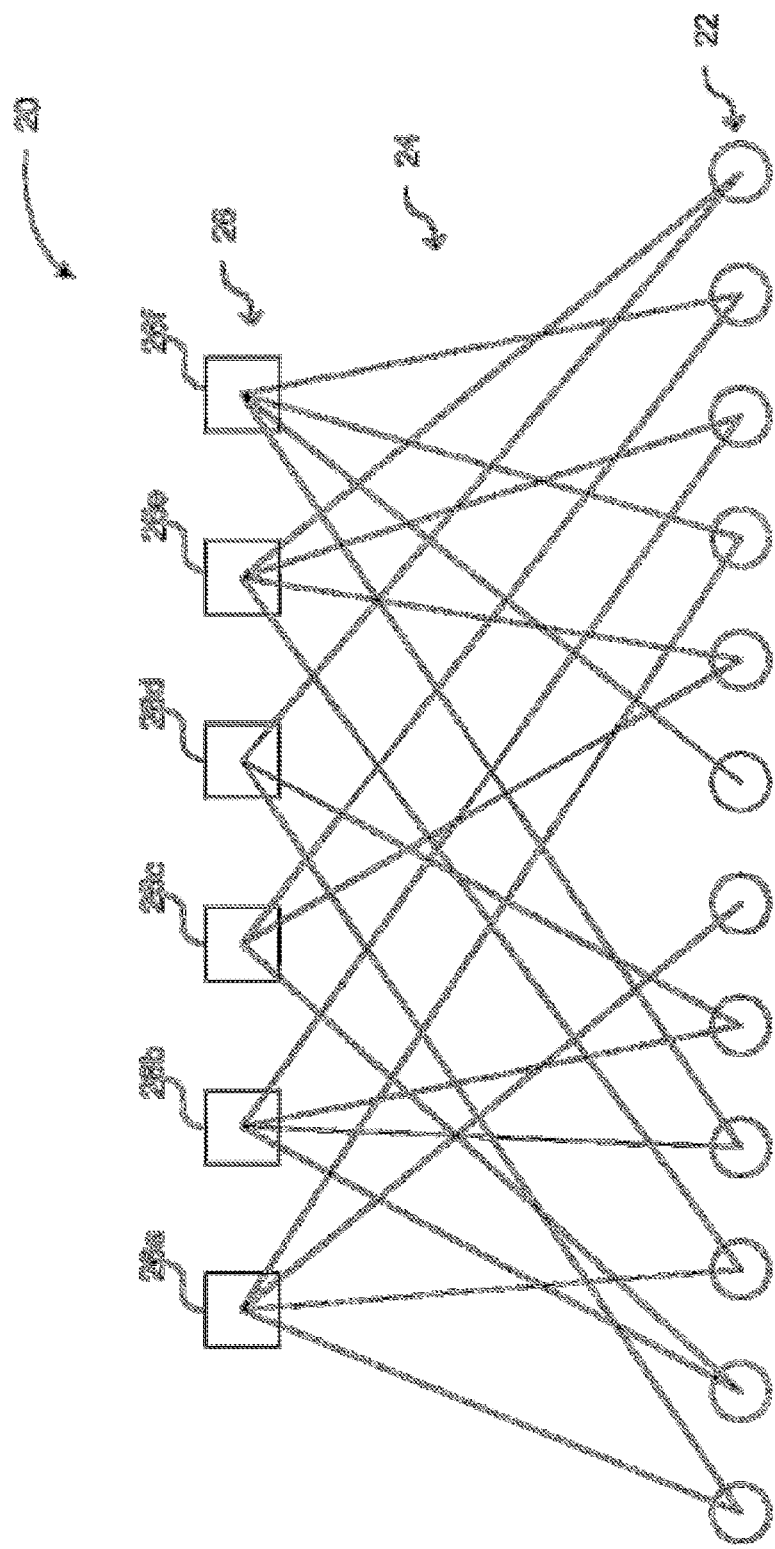
FIG. 2 illustrates an example Tanner graph.
Figure 3:
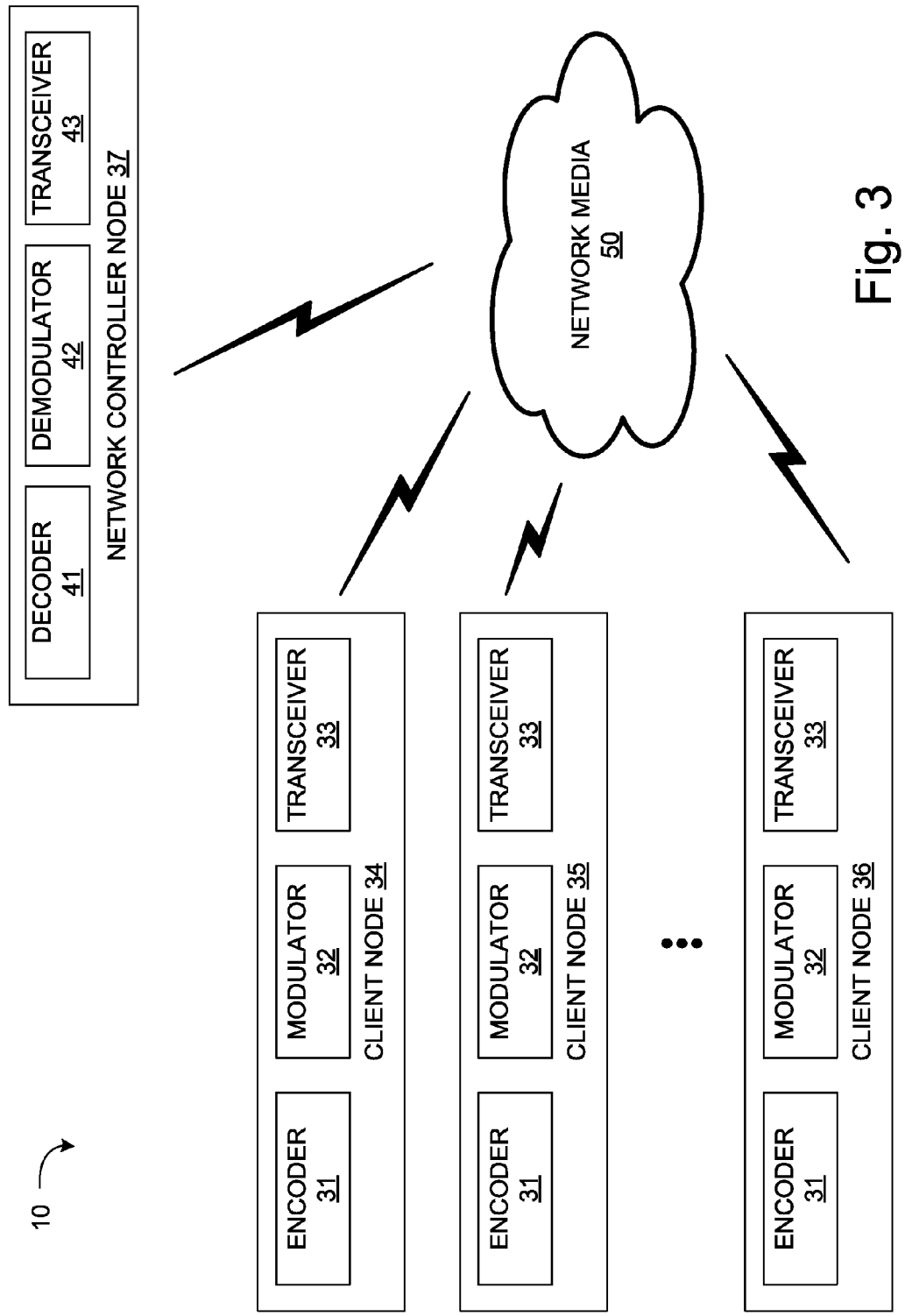
FIG. 3 is a block diagram of a network in accordance with one embodiment of the systems and methods described herein.

One embodiment of the disclosed includes a party check matrix that can be used with a variety of data storage and communication systems. For example, an LDPC parity check matrix can be provided for a communication system in which nodes sequentially or simultaneously transmit information to one or more other nodes in the network. FIG. 3 is a block diagram illustrating an example of a network 10 with which the LDPC codes can be used. After reading this description, one of ordinary skill in the art will understand how the LDPC codes described herein can be used with other communication, access and storage applications and environments. With reference to FIG. 3, in the illustrated example, network 10 includes one or more client nodes 34-36 and a network controller ("NC") node 37. In one embodiment, network 10 is a network in a home environment (e.g., a MoCA network), and nodes 34-37 are integrated with or coupled to devices in a home that communicate digital data in the form of messages between each other. Examples of such devices include set-top boxes, digital video recorders ("DVR"s), computers, televisions, routers, etc. In such examples, the digital data can include video and related data in data packets.

In the illustrated example, client nodes 34-37 are coupled to a network media 50 over which the digital data is transferred. In various embodiments, network media 50 is coaxial cable. However, network media 50 may be any other type of media, including other wired media or wireless media. In various embodiments, network 10 is a full mesh network so that any node on the network can communicate directly with any of the other nodes on the network in any direction. Alternatively, the network 10 may be an access network in which communications from client nodes go through a central node, such as, for example, the network controller 37. In one embodiment, network 10 includes a single NC node and up to 15 client nodes.

Each client node 34-36 includes an encoder 31 for encoding data, a modulator 32 for modulating data, and a transceiver 33 for transmitting data. Similarly, NC node 37 includes a transceiver 43 for receiving data, a demodulator 42 for demodulating data, and a decoder 41 for decoding data. The embodiment of FIG. 3 illustrates a scenario, disclosed in more detail below, in which multiple nodes (i.e., client nodes 34-36) simultaneously transmit data to a single node (i.e., NC node 37). However, in other embodiments, any node 34-37 may transmit data to any other node, so each node will further include corresponding modules to accommodate this mode of operation. In one embodiment, modules such as encoders, decoders, modulators and demodulators can be implemented in whole or in part by a general-purpose processor executing software instructions that are stored on a computer readable media such as memory. In other embodiments, the modules can be implemented using specialized processors or with any combination of software or hardware.

In one embodiment, two or more client nodes 34-36 transmit data to NC node 37. In one embodiment, the data is transmitted using Orthogonal Frequency Division Multiple ("OFDM"). In general, OFDM uses a large number of orthogonal sub-carriers to carry data. Each sub-carrier is modulated with a conventional modulation scheme, such as, for example, quadrature amplitude modulation (QAM) or phase shift keying (PSK). In some cases, the data is modulated at a low symbol rate to maintain a total data rate across all of the sub-carriers that is similar to the data rate achieved by a conventional single-carrier modulation scheme having the same bandwidth.

In one embodiment, the data transmitted from nodes 34-36 is first encoded using an LDPC parity check matrix. The LDPC parity check matrix may be partitioned into an matrix $$H=[H_1|H_2]$$

in which $H_1$ defines a systematic or data portion of the LDPC and $H_2$ defines a parity portion of the LDPC. Accordingly, $H_1$ can be configured to define data connections and $H_2$ configured to satisfy the parity condition (e.g., XOR=0).

In various embodiments, each element of the parity portion of the parity check matrix, $H_2$, represents a circular shifted identity submatrix and a negative entry (e.g., "−1") indicates an all-zeros submatrix. The value of a given matrix element is the amount of cyclic shift applied to each row of the identity submatrix for that element. The column weight of each column of the parity check portion, $H_2$, can be determined by summing the non-negative entries in each column. In various embodiments, the code and parity check portions are chosen such that the weights of each column, or of a group of columns, of the parity check portion, $H_2$, are the same. More particularly, in one embodiment, the code is designed such that the weights of all but one column of parity check portion, $H_2$, are the same. In some embodiments, the weights of all but the first column of parity check portion, $H_2$, are the same. In various embodiments, the column weight of $H_1$ is the same for all columns. In further embodiments, there are no non-negative entries in systematic portion, $H_1$, therefore, each column of systematic portion, $H_1$, has the same weight.

Consider a specific example in which the parity check matrix is a 7×46 parity check matrix, also partitioned into $H=[H_1|H_2]$, where $H_1$ defines a 7×39 systematic portion of the LDPC, and $H_2$ defines a 7×7 parity portion of the LDPC. Consider a further example in which each element of the 7×7 parity check portion, $H_2$, of the matrix represents a circular shifted 100×100 identity submatrix, a "−1" indicates a 100× 100 all zeros submatrix. As with the general case, the value of a given matrix element identifies (or actually is) the amount of cyclic shift applied to each row of the identity submatrix. In various embodiments, the column weight of $H_1$ is the same for all columns, which for a 7×39 systematic portion results in a column weight 7 for all columns. Because parity check portion, $H_2$, is a 7×7 matrix, the maximum column weight for each column of the parity check portion, $H_2$, is seven. As noted above, in various embodiments some or all of the columns of parity check portion, $H_2$, have the same weight. In one embodiment, one column of $H_2$ has the maximum weight (in this example, 7) and the rest of the parity portion has lesser column weight (e.g., 1-6) that is the same across those remaining columns.

Figure 4A:
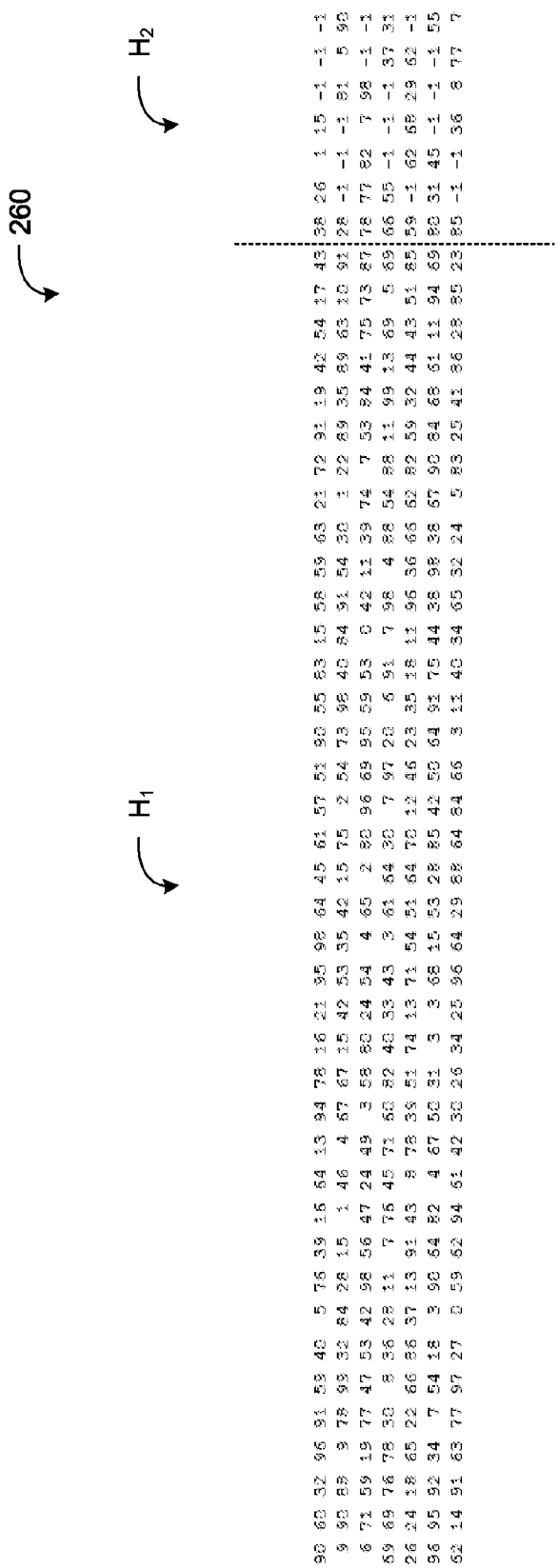
FIGS. 4A and 4B, illustrates an example LDPC code matrix in accordance with one embodiment of the systems and methods described herein.
Figure 4B:
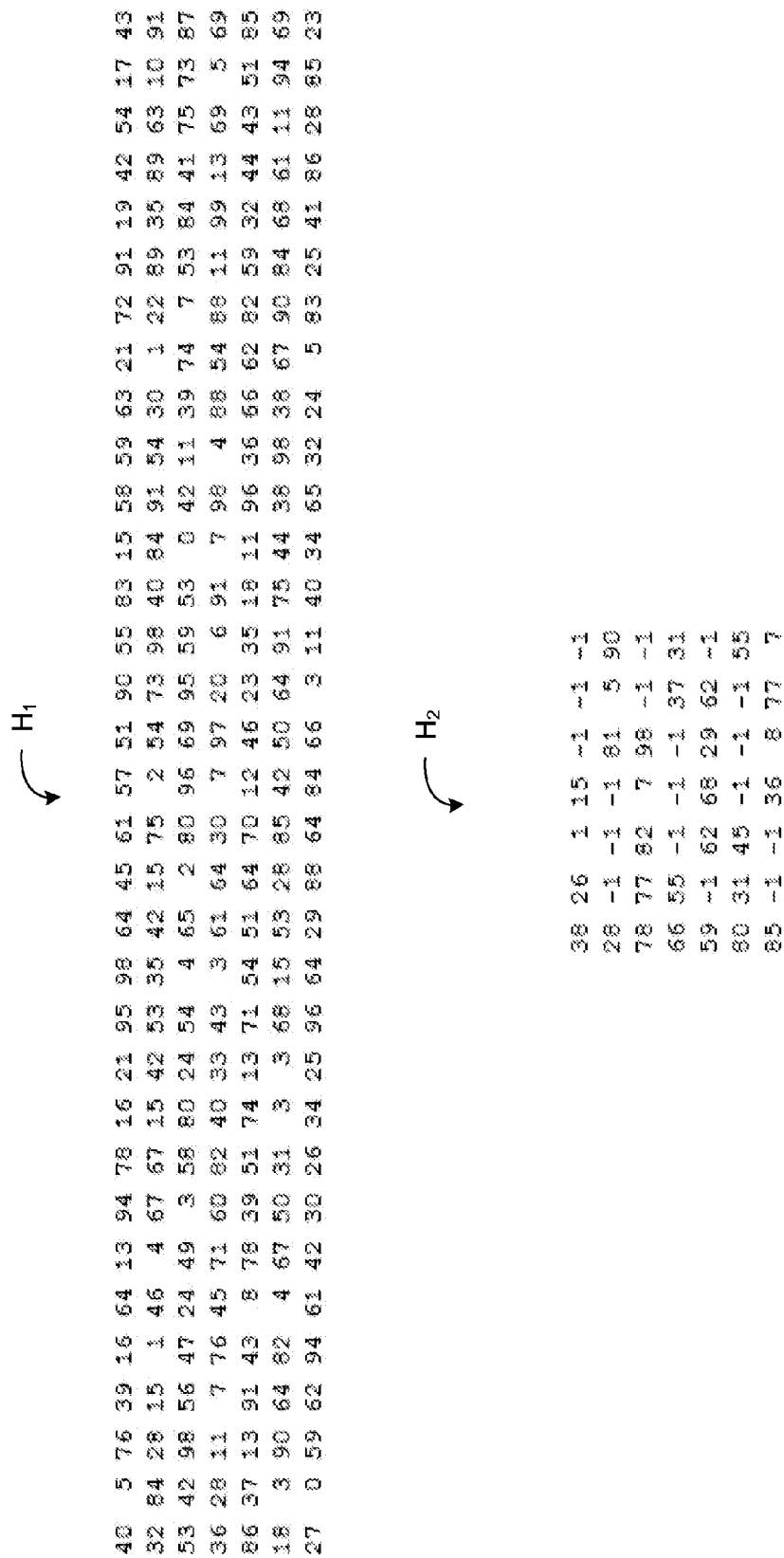

FIG. 4, which comprises FIGS. 4A and 4B, is a diagram illustrating one example of an LDPC parity check matrix in accordance with one embodiment of the systems and methods described herein. FIG. 4A shows the entire example LDPC parity check matrix, while FIG. 4B shows the components of the matrix, $H_1$ and $H_2$, slightly enlarged for ease of viewing. In this example, an LDPC parity check matrix 260 may be partitioned into $H=[H_1|H_2]$. Like the example above, in this example, the matrix is a 7×46 parity check matrix, having seven rows and 46 columns total. Data portion, $H_1$ defines a 7×39 systematic portion of the LDPC, and $H_2$ defines a 7×7 parity portion of the LDPC. Also like the example above, each element of the matrix identifies or defines an amount of cyclic shift in the corresponding identity matrix (e.g., a 100×100 identity submatrix).

As seen from FIG. 4, in this example, each column of the data portion, $H_1$, has a weight of 7. As also seen from FIG. 4, in this example, the first column of parity check portion, $H_2$, has a weight of 7, and each remaining column of parity check, portion, $H_2$, has weight of 4, as calculated by summing the non-negative entries in each column.

Figure 5A:
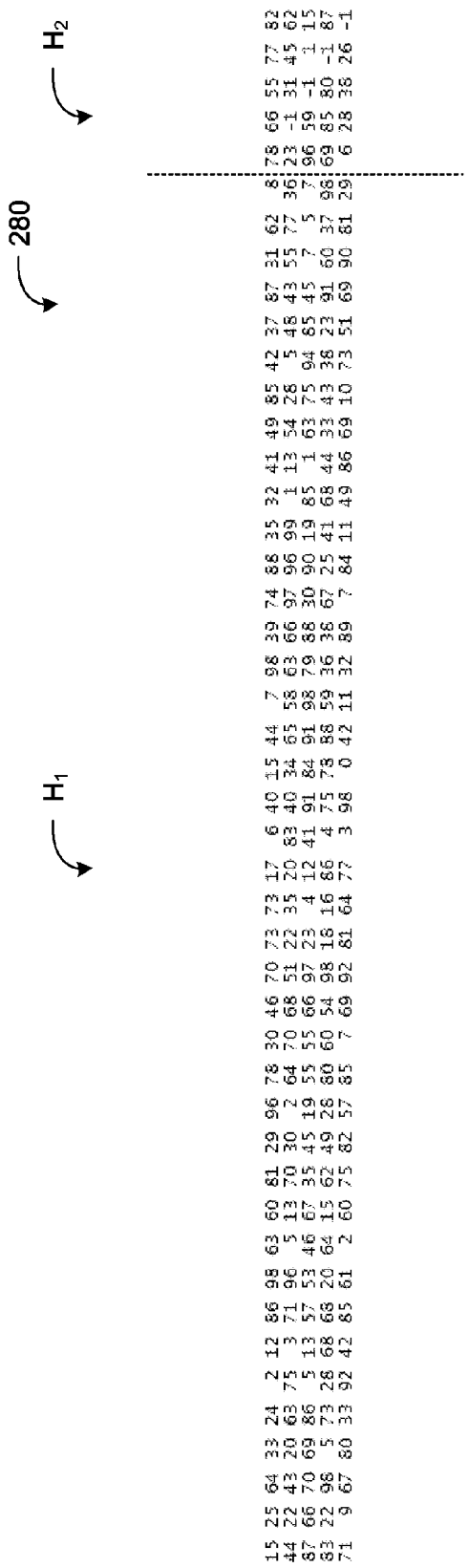
FIGS. 5A and 5B, illustrates another example LDPC code matrix in accordance with one embodiment of the systems and methods described herein.
Figure 5B:
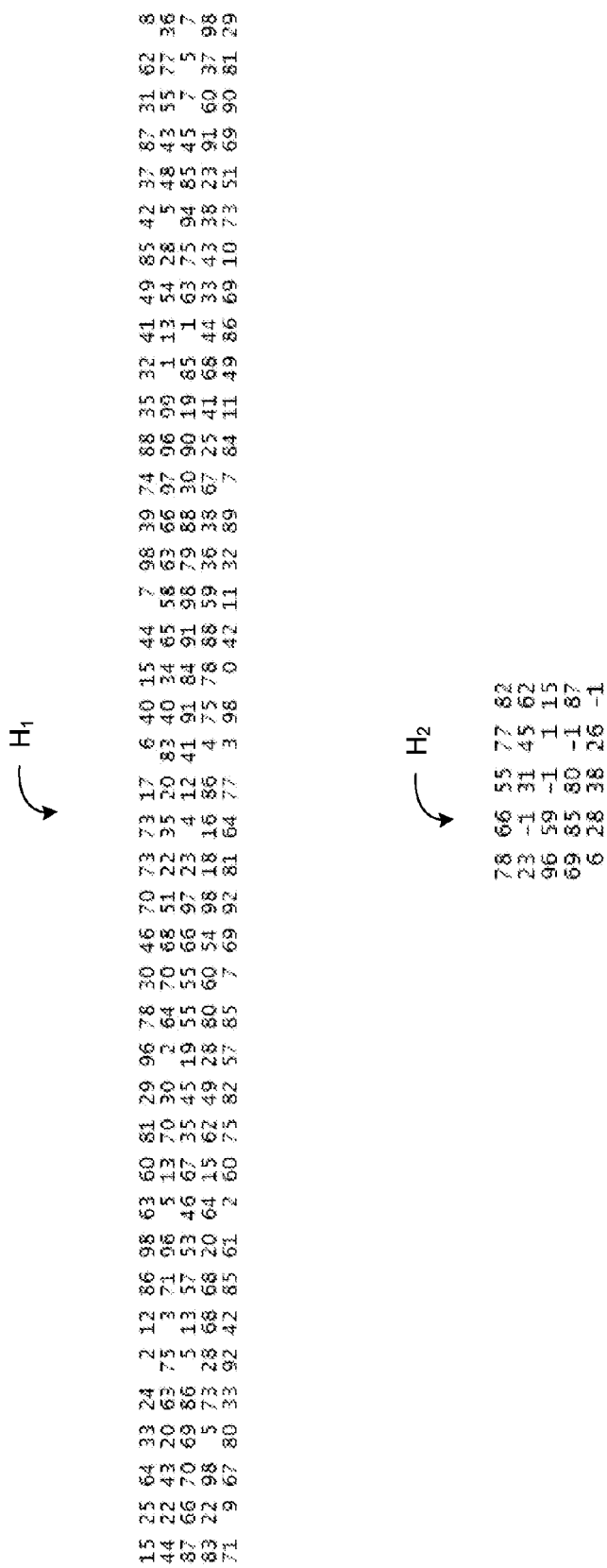

In other embodiments, a similar structure, higher rate LDPC may be used in the access network. FIG. 5, which comprises FIGS. 5A and 5B, illustrates another example of a systematic quasi-cyclic LDPC code described in the parity check matrix 280. FIG. 5A shows the entire example LDPC parity check matrix 280, while FIG. 5B shows the components of the matrix, $H_1$ and $H_2$, slightly enlarged for ease of viewing.

In this example, the composite parity check matrix is 500× 4600 where each code word has parity length of 500 bits and a payload length of 4100 bits. The column weight of $H_1$ is regular with column weight 5. The first column of $H_2$ has a column weight of 5 and the rest of the parity portion has column weight of 4.

Figure 6A:
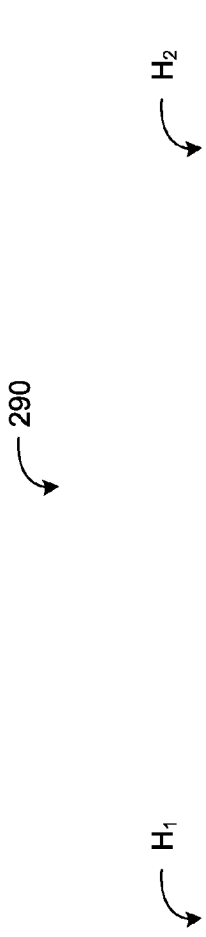
Figure 6B:
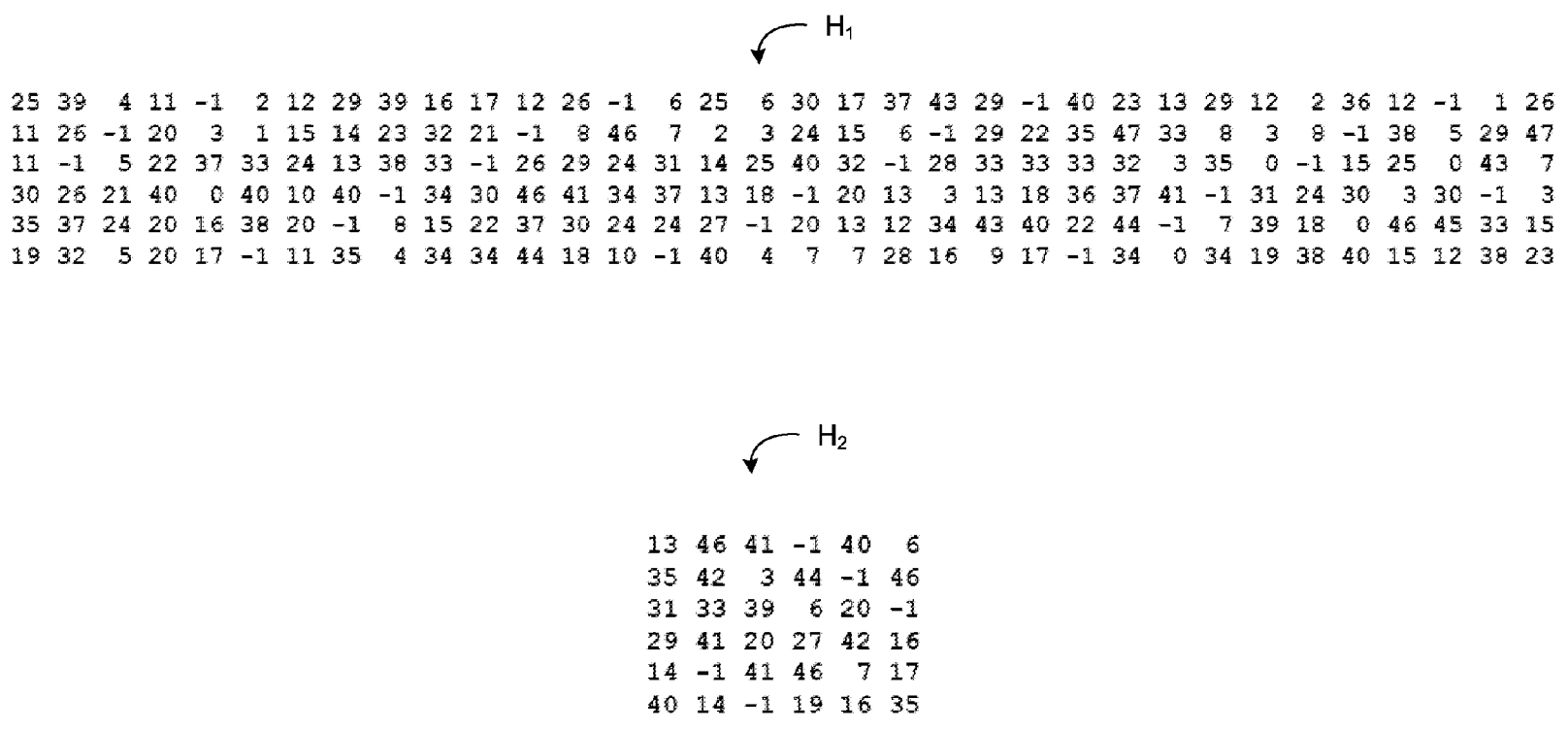

FIG. 6, which comprises FIGS. 6A and 6B, illustrates yet another example of a systematic quasi-cyclic LDPC code parity check matrix 290. FIG. 6A shows the entire example LDPC parity check matrix 290, while FIG. 6B shows the components of the matrix, $H_1$ and $H_2$, slightly enlarged for ease of viewing.

This 6×40 parity check matrix is partitioned into $H=[H_1|H_2]$ where, $H_1$ defines the 6×34 systematic portion, and $H_2$ defines the 6×6 parity portion. Each element of the parity check matrix represents a right circular shifted 48×48 identity matrix and the "−1" indicates a 48×48 all zeroes matrix. The value of the matrix element is the amount of right cyclic shift applied to each row of the identity matrix. The composite parity check matrix is 288×1920 where each codeword has parity length of 288 bits and payload length of 1632 bits. The first column of $H_2$ has a column weight of 6 and the rest of the parity portion has column weight of 5.

Figure 7A:
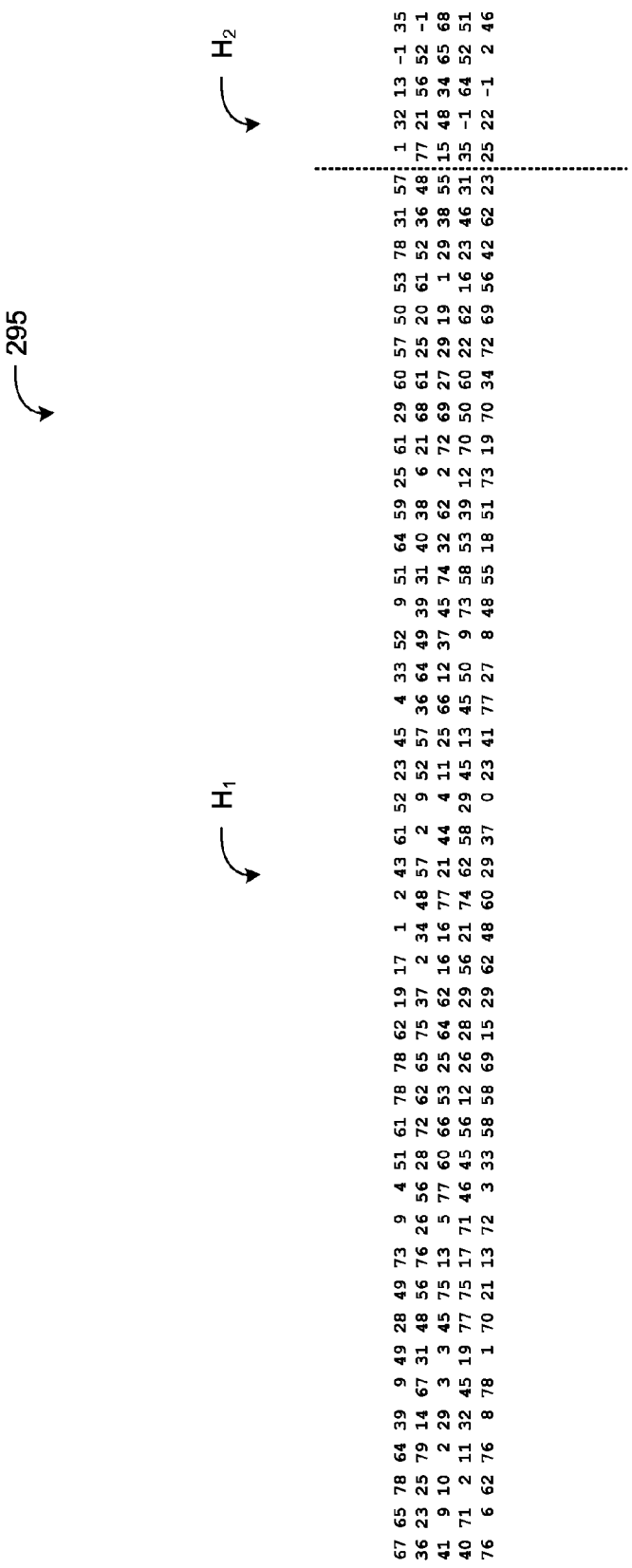
FIGS. 7A and 7B, illustrates another example LDPC code matrix in accordance with one embodiment of the systems and methods described herein.
Figure 7B:
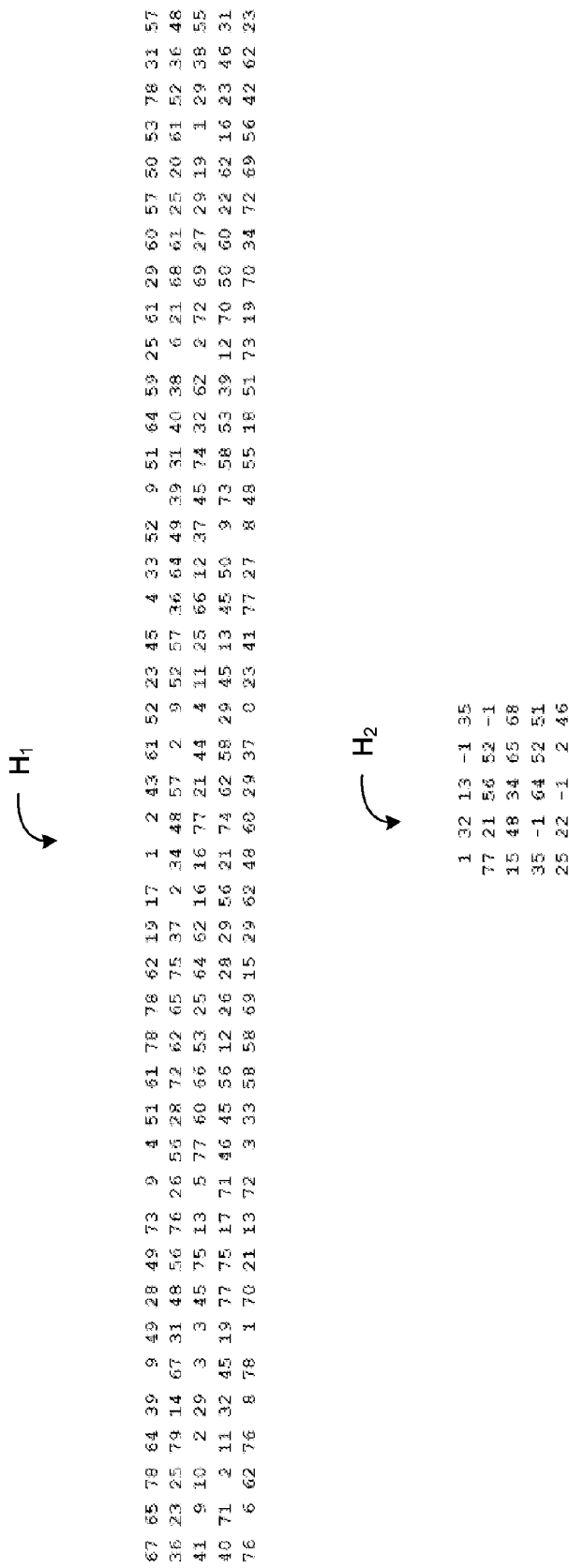

FIG. 7, which comprises FIGS. 7A and 7B, illustrates still another example of a systematic quasi-cyclic LDPC code parity check matrix 295. FIG. 7A shows the entire example LDPC parity check matrix 295, while FIG. 7B shows the components of the matrix, $H_1$ and $H_2$, slightly enlarged for ease of viewing.

This 5×48 parity check matrix is partitioned into $H=[H_1|H_2]$ where, $H_1$ defines the 5×43 systematic portion, and $H_2$ defines the 5×5 parity portion. In this embodiment each element of the parity check matrix represents a right circular shifted 80×80 identity matrix and the "−1" indicates a 80×80 all zeroes matrix. The value of the matrix element is the amount of right cyclic shift applied to each row of the identity-matrix. The composite parity check matrix is 400× 3840 where each codeword has parity length of 400 bits and payload length of 3440 bits. The first column of $H_2$ has a column weight of 5 and the test of the parity portion has column weight of 4.

Figure 8:
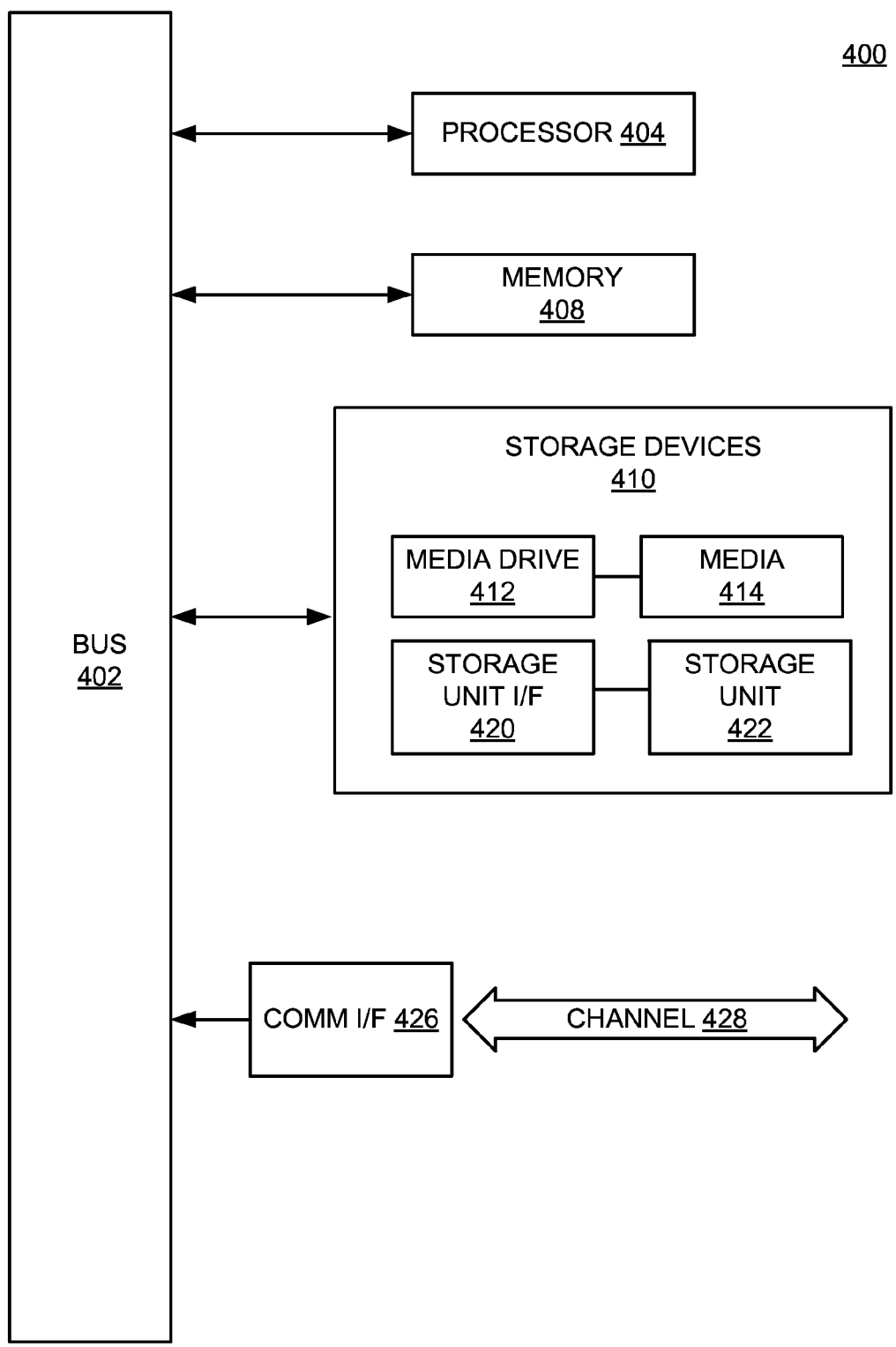
FIG. 8 is a diagram illustrating an example of a computing module that may be used in implementing various features of embodiments of the disclosed systems and methods.

With the LDPC matrices described herein, including the specific example matrices presented, variations on the matrix can be made and still yield desired performance. For example, for the LDPC matrices disclosed herein, the matrix can comprise any permutation of the rows or columns of the matrix. Also, the matrix can be a modulo P of that matrix. For example, for any X greater than or equal to zero (i.e., non-negative), the non-negative values, H, of the matrix can also be (H+X)mod P, where P is the parallelism degree of the code embodied by the matrix.

Where components or modules of the invention are implemented in whole or in part using software, in one embodiment, these software elements can be implemented to operate with a computing or processing module capable of carrying out the functionality described with respect thereto. One example of such a computing module is shown in FIG. 8. Various embodiments are described in terms of this example-computing module 400. After reading this description, if will become apparent to a person skilled in the relevant art how to implement the invention using other computing modules or architectures.

Referring now to FIG. 8, computing module 400 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 400 might also represent computing capabilities embedded within, or otherwise available to a given device. For example, a computing module 400 might be found in electronic devices such as, for example, digital cameras, navigation systems, cellular telephones, portable computing devices, modems, routers, wireless access points (WAPs), terminals and other electronic devices that might include some form of processing capability.

Computing module 400 might include, for example, one or more processors, controllers, control modules, or other processing devices, such as a processor 404. Processor 404 might be implemented using a general-purpose or special-purpose processing engine such as, for example, a microprocessor, controller, or other control logic. In the illustrated example, processor 404 is connected to a bus 402, although any communication medium can be used to facilitate interaction with other components of computing module 400 or to communicate externally.

Computing module 400 might also include one or more memory modules, simply referred to herein as main memory 408. For example, preferably random access memory (RAM) or other dynamic memory, might be used for storing information and instructions to be executed by processor 404. Main memory 408 might also be used for storing temporary variables or other intermediate information during execution of instructions to be executed by processor 404. Computing module 400 might likewise include a read only memory ("ROM") or other static storage device coupled to bus 402 for storing static information and instructions for processor 404.

The computing module 400 might also include one or more various forms of information storage mechanism 410, which might include, for example, a media, drive 412 and a storage unit interface 420. The media drive 412 might include a drive or other mechanism to support fixed or removable storage media 414. For example, a hard disk drive, a floppy disk drive, a magnetic tape drive, an optical disk drive, a CD or DVD drive (R or RW), or other removable or fixed media drive might be provided. Accordingly, storage media 414 might include, for example, a hard disk, a floppy disk, magnetic tape, cartridge, optical disk, a CD or DVD, or other fixed or removable medium that is read by, written to or accessed by media drive 412. As these examples illustrate, the storage media 414 can include a computer usable storage medium having stored therein computer software or data.

In alternative embodiments, information storage mechanism 410 might include other similar instrumentalities for allowing computer programs or other instructions or data, to be loaded into computing module 400. Such instrumentalities might include, for example, a fixed or removable storage unit 422 and an interface 420. Examples of such storage units 422 and interfaces 420 can include a program cartridge and cartridge interface, a removable memory (for example, a flash memory or other removable memory module) and memory slot, a PCMCIA slot and card, and other fixed or removable storage units 422 and interfaces 420 that allow software and data to be transferred from the storage unit 422 to computing module 400.

Computing module 400 might also include a communications interface 424. Communications interface 424 might be used to allow software and data to be transferred between computing module 400 and external devices. Examples of communications interface 424 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 424 might typically be carried on signals, which can be electronic, electromagnetic (which includes optical) or other signals capable of being exchanged by a given communications interface 424. These signals might be provided to communications interlace 424 via a channel 428. This channel 428 might carry signals and might be implemented using a wired or wireless communication medium. Some examples of a channel might include a MoCA channel over coaxial cable, phone line, a cellular link, an RF link, an optical link, a network interface, a local or wide area network, and other wired or wireless communications channels.

In this document, the terms "computer program medium" and "computer usable medium" are used to generally refer to physical storage media such as, for example, memory 408, storage unit 420, and media 414. These and other various forms of computer program storage media or computer usable storage media may be involved in storing and providing one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 400 to perform features or functions of the disclosed method and apparatus, as discussed herein. While various embodiments of the disclosed method and apparatus have been described above, it should be understood that they have been presented by way of example only, and not of limitation. Likewise, the various diagrams may depict an example architectural or other configuration for the disclosed method and apparatus, which is done to aid in understanding the features and functionality that can be included in the disclosed method and apparatus. The claimed invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the disclosed method and apparatus. Also, a multitude of different constituent module names other than those depicted herein can be applied to the various partitions. Additionally, with regard to flow diagrams, operational descriptions and method claims, the order in which the blocks are presented herein shall not mandate that various embodiments be implemented to perform the recited functionality in the same order unless the context dictates otherwise.

Although the disclosed method and apparatus is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one of more of the other embodiments of the disclosed method and apparatus, whether or not such embodiments are described and whether or not such features are presented as being a part of a described embodiment. Thus, the breadth and scope of the claimed invention should not be limited by any of the above-described embodiments, which are presented as mere, examples for illustration-only.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package, indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A node comprising:
   a non-transitory computer readable medium storing a sequence of instructions; and
   a processor operable to execute the sequence of instructions to encode or decode data according to a first (low-density parity-check) LDPC parity check matrix, the first LDPC parity check matrix is a 7×46 matrix comprising:
   a) a systematic portion having a plurality of systematic elements having a value, the value of each systematic element determining a cyclic shift to be applied to rows of an identity submatrix corresponding to the systematic element, the systematic portion comprising a 7×39 matrix, the identity submatrix corresponding to each systematic element comprising a 100×100 identity matrix; and
   b) a parity portion having a plurality of parity elements having a value, the value of each parity element determining a cyclic shift to be applied to rows of an identity submatrix corresponding to the parity element, the parity portion comprising a 7×7 matrix, the identity submatrix corresponding to each parity element comprising a 100×100 identity matrix.

2. The node of claim 1, wherein the processor is operable to execute the sequence of instructions to encode or decode data according to a second LDPC parity check matrix, the second LDPC parity check matrix comprising a permutation of the rows or columns of the first LDPC parity check matrix.

3. The node of claim 1, wherein the processor is operable to execute the sequence of instructions to encode or decode data according to a second LDPC parity check matrix, the second LDPC parity check matrix comprising the first LDPC parity check matrix modified such that non-negative elements, H, of the first LDPC parity check matrix are replaced by (H+X)mod P, wherein X is greater than or equal to zero, and P is a parallelism of a code embodied by the first LDPC parity check matrix.

4. A node comprising:
   a non-transitory computer readable medium storing a sequence of instructions; and
   a processor operable to execute the sequence of instructions to encode or decode data according to a first (low-density parity-check) LDPC parity check matrix, the first LDPC parity check matrix comprising:
   a) a systematic portion having a plurality of systematic elements having a value, the value of each systematic element determining a cyclic shift to be applied to rows of an identity submatrix corresponding to the systematic element; and
   b) a parity portion having a plurality of parity elements having a value, the value of each parity element determining a cyclic shift to be applied to rows of an identity submatrix corresponding to the parity element,
   wherein the systematic portion comprises a 5×41 matrix and the parity portion comprises a 5×5 matrix.

5. The node of claim 4, wherein the processor is operable to execute the sequence of instructions to encode or decode data according to a second LDPC parity check matrix, the second LDPC parity check matrix comprising a permutation of the rows or columns of the first LDPC parity check matrix.

6. The node of claim 4, wherein the processor is operable to execute the sequence of instructions to encode or decode data according to a second LDPC parity check matrix, the second LDPC parity check matrix comprising the first LDPC parity check matrix modified such that non-negative elements, H, of the first LDPC parity check matrix are replaced by (H+X)mod P, wherein X is greater than or equal to zero, and P is a parallelism of a code embodied by the first LDPC parity check matrix.

7. A node comprising:
   a non-transitory computer readable medium storing a sequence of instructions; and
   a processor operable to execute the sequence of instructions to encode or decode data according to a first (low-density parity-check) LDPC parity check matrix, the first LDPC parity check matrix comprising:
   a) a systematic portion having a plurality of systematic elements having a value, the value of each systematic element determining a cyclic shift to be applied to rows of an identity submatrix corresponding to the systematic element; and b) a parity portion having a plurality of parity elements having a value, the value of each parity element determining a cyclic shift to be applied to rows of an identity submatrix corresponding to the parity element, wherein the systematic portion comprises a 6×34 matrix and the parity portion comprises a 6×6 matrix.

8. The node of claim 7, wherein the processor is operable to execute the sequence of instructions to encode or decode data according to a second LDPC parity check matrix, the second LDPC parity check matrix comprising a permutation of the rows or columns of the first LDPC parity check matrix.

9. The node of claim 7, wherein the processor is operable to execute the sequence of instructions to encode or decode data according to a second LDPC parity check matrix, the second LDPC parity check matrix comprising the first LDPC parity check matrix modified such that non-negative elements, H, of the first LDPC parity check matrix are replaced by (H+X)mod P, wherein X is greater than or equal to zero, and P is a parallelism of a code embodied by the first LDPC parity check matrix.

10. A node comprising:
a non-transitory computer readable medium storing a sequence of instructions; and
a processor operable to execute the sequence of instructions to encode or decode data according to a first (low-density parity-check) LDPC parity check matrix, the first LDPC parity check matrix comprising:
a) a systematic portion having a plurality of systematic elements having a value, the value of each systematic element determining a cyclic shift to be applied to rows of an identity submatrix corresponding to the systematic element; and
b) a parity portion having a plurality of parity elements having a value, the value of each parity element determining a cyclic shift to be applied to rows of an identity submatrix corresponding to the parity element, wherein the systematic portion comprises a 5×43 matrix and the parity portion comprises a 5×5 matrix.

11. The node of claim 10, wherein the processor is operable to execute the sequence of instructions to encode or decode data according to a second LDPC parity check matrix, the second LDPC parity check matrix comprising a permutation of the rows or columns of the first LDPC parity check matrix.

12. The node of claim 10, wherein the processor is operable to execute the sequence of instructions to encode or decode data according to a second LDPC parity check matrix, the second LDPC parity check matrix comprising the first LDPC parity check matrix modified such that non-negative elements, H, of the first LDPC parity check matrix are replaced by (H+X)mod P, wherein X is greater than or equal to zero, and P is a parallelism of a code embodied by the first LDPC parity check matrix.

13. The node of claim 1, wherein the encoded data is communicated between one or more other nodes.

14. The node of claim 1, wherein the encoded data is communicated as packet according to a Media over Coax Alliance (MoCA) specification.

15. The node of claim 4, wherein the encoded data is communicated between one or more other nodes.

16. The node of claim 4, wherein the encoded data is communicated as packet according to a Media over Coax Alliance (MoCA) specification.

17. The node of claim 7, wherein the encoded data is communicated between one or more other nodes.

18. The node of claim 7, wherein the encoded data is communicated as packet according to a Media over Coax Alliance (MoCA) specification.

19. The node of claim 10, wherein the encoded data is communicated between one or more other nodes.

20. The node of claim 10, wherein the encoded data is communicated as packet according to a Media over Coax Alliance (MoCA) specification.

* * * * *